(12) United States Patent
Schaeck et al.

(10) Patent No.: US 10,295,383 B2
(45) Date of Patent: May 21, 2019

(54) MEASURING AMPLIFIER WITH BACKGROUND ADJUSTMENT AND METHOD THEREFOR

(71) Applicant: Hottinger Baldwin Messtechnik GmbH, Darmstadt (DE)

(72) Inventors: Marco M. Schaeck, Roedermark (DE); Herbert Kitzing, Darmstadt (DE)

(73) Assignee: Hottinger Baldwin Messtechnik GmbH, Darmstadt (DE)

( * ) Notice: Subject to any disclaimer, the term of this patent is extended or adjusted under 35 U.S.C. 154(b) by 0 days.

(21) Appl. No.: 14/916,398

(22) PCT Filed: Sep. 5, 2014

(86) PCT No.: PCT/DE2014/000463
§ 371 (c)(1),
(2) Date: Jun. 30, 2016

(87) PCT Pub. No.: WO2015/032382
PCT Pub. Date: Mar. 12, 2015

(65) Prior Publication Data
US 2016/0298987 A1     Oct. 13, 2016

(30) Foreign Application Priority Data
Sep. 6, 2013   (DE) .................. 10 2013 014 876

(51) Int. Cl.
*H03F 3/45*     (2006.01)
*H03M 1/10*     (2006.01)
(Continued)

(52) U.S. Cl.
CPC ........... *G01D 18/00* (2013.01); *G01D 18/004* (2013.01); *H03F 3/45071* (2013.01);
(Continued)

(58) Field of Classification Search
None
See application file for complete search history.

(56) References Cited

U.S. PATENT DOCUMENTS

| | | | | |
|---|---|---|---|---|
| 7,227,479 B1 * | 6/2007 | Chen | ................... | H03M 1/1004 |
| | | | | 341/118 |
| 2001/0010500 A1 * | 8/2001 | Lundin | ............... | H03M 1/1038 |
| | | | | 341/120 |

(Continued)

FOREIGN PATENT DOCUMENTS

| | | |
|---|---|---|
| DE | 32 06 192 | 9/1983 |
| DE | 102006005835 | 8/2007 |

(Continued)

OTHER PUBLICATIONS

Dyer, K.C., Daihong Fu, S.H. Lewis, and P.J. Hurst. "An Analog Background Calibration Technique for Time-interleaved Analog-to-digital Converters." IEEE Journal of Solid-State Circuits 33.12 (1998): 1912-919.*

(Continued)

*Primary Examiner* — J. E. Schoenholtz
(74) *Attorney, Agent, or Firm* — W. F. Fasse

(57) ABSTRACT

A measuring amplifier (103) with background calibration and adjustment amplifies, digitizes and processes at least one measurement signal (111) from at least one measuring transducer (102) with the aid of at least one amplifier arrangement (108). This can be intermittently replaced by an additional amplifier arrangement (107), which enables interruption-free direct calibration and, if necessary, adjustment of the amplifier arrangement. In the calibration, both a zero point error and an amplification error of the amplifier arrangement are reliably determined. A high accuracy is achieved without measurement interruption. Only one addi- (Continued)

tional amplifier arrangement is generally required, even for a measuring amplifier with plural channels.

21 Claims, 4 Drawing Sheets

(51) Int. Cl.
*H03M 1/12* (2006.01)
*G01D 18/00* (2006.01)

(52) U.S. Cl.
CPC ....... *H03M 1/1004* (2013.01); *H03M 1/1028* (2013.01); *H03F 2200/261* (2013.01); *H03F 2200/375* (2013.01); *H03M 1/12* (2013.01)

(56) References Cited

U.S. PATENT DOCUMENTS

| | | | | |
|---|---|---|---|---|
| 2003/0080885 A1* | 5/2003 | Tamba | ................ | H03M 1/1038 341/120 |
| 2007/0171116 A1* | 7/2007 | Fuse | ................... | H03M 1/1038 341/161 |
| 2010/0002747 A1* | 1/2010 | Bosch | ...................... | G01K 7/01 374/170 |
| 2012/0081246 A1* | 4/2012 | Caci | .................... | H03M 1/1215 341/155 |
| 2013/0106632 A1* | 5/2013 | Petigny | ............... | H03M 1/1004 341/120 |
| 2016/0149582 A1* | 5/2016 | Ragab | ................. | H03M 1/0626 341/120 |

FOREIGN PATENT DOCUMENTS

| | | | | |
|---|---|---|---|---|
| DE | 102007052440 | | 5/2009 | |
| EP | 2 056 460 | | 5/2009 | |
| EP | 2056460 | A1 * | 5/2009 | .............. H03F 1/30 |
| JP | 63-209208 | A | 8/1988 | |
| JP | 01-102335 | A | 4/1989 | |
| JP | 11-085167 | A | 3/1999 | |
| JP | 2008-131298 | A | 6/2008 | |
| JP | 2011-049746 | A | 3/2011 | |
| WO | WO 0219531 | A1 * | 3/2002 | .......... H03M 1/1004 |

OTHER PUBLICATIONS

Jamal, S.M., Daihong Fu, N.C.-J. Chang, P.J. Hurst, and S.H. Lewis. "A 10-b 120-Msample/s Time-interleaved Analog-to-digital Converter with Digital Background Calibration." IEEE Journal of Solid-State Circuits 37.12 (2002): 1618-627.*
International Search Report for WO 2015032382.*
K. C. Dyer, D. Fu, S. H. Lewis, and P. J. Hurst, "A comparison of monolithic background calibration in two time-interleaved analog-to-digital converters," in Proc. IEEE Int. Symp. Circuits and Systems, vol. 1, May 1998, pp. 13-16.*
Figueiredo, Michael, Joalo Goes, and Guiomar Evans. "Chapter 2 General Overview of Pipeline Analog-to-Digital Converters." Reference-Free CMOS Pipeline Analog-to-Digital Converters. New York, NY: Springer New York, 2013.*
Klaus, Leonard, et al. "Calibration of Bridge-, Charge- and Voltage Amplifiers for Dynamic Measurement Applications." Metrologia, vol. 52, No. 1, Aug. 2015, pp. 72-81., doi:10.1088/0026-1394/52/1/72.*
International Search Report of the International Searching Authority for International Application PCT/DE2014/000463, dated Feb. 3, 2015, 3 pages, European Patent Office, HV Rijswijk, Netherlands.
PCT International Preliminary Report on Patentability including English Translation of PCT Written Opinion of the International Searching Authority for International Application PCT/DE2014/000463, dated Mar. 8, 2016, 21 pages, International Bureau of WIPO, Geneva, Switzerland.
Kenneth C. Dyer et al., "An Analog Background Calibration Technique for Time-Interleaved Analog-to-Digital Converters", IEEE Journal of Solid-State Circuits, IEEE Service Center, Piscataway, NJ, USA, vol. 33, No. 12, Dec. 1998, XP011060879, ISSN: 0018-9200, pp. 1912 to 1919.
Shay Maymon et al., "Quantization and Compensation in Sampled Interleaved Multi-Channel Systems", IEEE International Conference on Acoustics Speech and Signal Processing, Piscataway, NJ, USA, Mar. 14, 2010, XP031697832, ISBN: 978-1-4244-4295-9, pp. 3622 to 3625.
Partial English translation of Japanese Office Action in Japanese Patent Application No. 2016-539418, dated Apr. 4, 2018, 5 pages.

* cited by examiner

US 10,295,383 B2

MEASURING AMPLIFIER WITH BACKGROUND ADJUSTMENT AND METHOD THEREFOR

FIELD OF THE INVENTION

The present invention relates to a measuring amplifier with background calibration and adjustment as well as a method for performing the background calibration and adjustment for such a measuring amplifier.

BACKGROUND OF THE INVENTION

Electrical input signals are converted into measurement values with a measuring amplifier. In that regard, components such as amplifiers, analog-digital converters, filters, etc. are utilized, with the aid of which the input signals are amplified, digitized, filtered, etc., in order to obtain utilizable measurement values. The electrical input signals can be supplied by a measuring transducer or several measuring transducers. Correspondingly, a measuring amplifier can comprise one channel or several channels.

The circuits of a measuring amplifier mostly comprise a plurality of individual components, whereby each one of the components has its own tolerance. Especially in a precision measuring amplifier, the tolerances may only be very small. While the original tolerances of the components may still be controlled quite well through strict selection processes, nearly no influence can be had on the drift behavior of the individual components caused by temperature and aging.

Precision measuring amplifiers of the applicant can measure, or convert input signals into measurement values, with a class accuracy of 5 ppm, that is to say 0.0005%, at the boundary of the physical limit. In order to ensure this accuracy and maintain it constant over many years, a device-internal automatic calibration and adjustment or auto-adjustment is necessary. In that regard, the drift of the measuring amplifier is compensated cyclically with an internal reference signal, and in this manner the high class accuracy of the measuring amplifier is maintained constant over its operation time. After the learning or run-up phase of the measuring amplifier, this process involves merely an insignificant re-adjustment.

In earlier-utilized methods, the measurement is cyclically interrupted for a certain time and the zero point and the amplification is corrected with the aid of two reference points (zero value and end value). Thereafter, the measurement can again be continued. However, at this point, one must wait for the filter start-up transient times of filters in the measuring amplifier, which in part are quite considerable. These interruptions of the measuring operation are disturbing for the user and are not acceptable in certain applications. Therefore it is desirable to avoid such interruptions.

A method is disclosed in the EP 2 056 460 B1, with which measurement values of a measuring amplifier can be corrected without interrupting the measuring operation. In that regard, a first amplifier circuit continuously converts an input signal that is permanently supplied to it, that is to say without any interruption, into measurement values. A second amplifier circuit is circuit-connected parallel to the first amplifier circuit. The input signal, a reference signal and a zero or null signal are alternately supplied to it. Measurement values of the second amplifier circuit are corrected based on the reference signal and the zero signal. Thereupon, the differences between the corrected measurement values of the second amplifier circuit and the uncorrected measurement values of the first amplifier circuit are determined at various different levels of the input signal, and based thereon, the zero point error and the amplification error are determined. On the basis of the determined errors, the measurement values of the first amplifier circuit can then be corrected. In this manner, measuring can be performed continuously. The measuring operation does not need be interrupted.

With the method described in the EP 2 056 460 B1, the zero point error and the amplification error can only be optimally determined if the input signal changes significantly. If the change or variation of the input signal is quasi-static, while the measurement value of the first amplifier circuit will be properly corrected in total, however not with respect to the distribution or division between the zero point error and the amplification error. An amplification error can always only be determined if a significant input signal variation regularly arises. When a significant change or variation of the input signal arises, then the measurement value will at first deviate due to the incorrect determination of the zero point error and amplification error. The zero point error and the amplification error are followed-up or re-adjusted and thus corrected after the jump in the input signal and its new determination. However, until then, the measurement value deviates for a certain time, which depends on the implementation.

In the method disclosed in the EP 2 056 460 B1, it additionally gives rise to an error propagation. In this method, the measuring amplifier is indirectly calibrated via an additional amplifier circuit. Due to the two-stage method—first the additional second amplifier circuit is calibrated, and then therefrom the error of the actual first amplifier circuit is derived—errors in each stage are summed together and can thus lead to a larger error of the calibration result.

Furthermore, the method described in the EP 2 056 460 B1 requires that the first amplifier circuit and the second amplifier circuit supply measurement values in parallel during the longest possible time period, in order to be able to determine the zero point error and the amplification error or the correction values for the measurement values of the first amplifier circuit based on the differences of these measurement values at various different input signal levels. Therefore, in measuring amplifiers with several channels, a further identically constructed amplifier circuit is required for each individual amplifier circuit. Thus, for a number N of channels, always 2×N amplifier circuits will be required. This hardware expenditure and complexity is often not practical for a precision measuring amplifier. The construction of a precision measuring amplifier is significantly more complex and costly than the construction of a measuring amplifier for standard requirements. Therefore, due to space and cost reasons, the doubled number of amplifier circuits can only rarely be utilized.

SUMMARY OF THE INVENTION

It is an object of at least one embodiment of the invention to provide an improved method for the uninterrupted calibrating and adjusting of a measuring amplifier as well as a corresponding measuring amplifier, in which all or at least a portion of the above explained disadvantages do not arise.

This object can be achieved with the method and the measuring amplifier according to the inventions as set forth herein.

According to a first aspect of the invention, in a method for the uninterrupted calibrating and adjusting of a measuring amplifier for N measurement signals, which comprises at least N+1 amplifier arrangements and is configured for outputting N measurement values, which correspond to the N measurement signals, the following steps are carried out, wherein N≥1 applies, and an index i runs from 1 to N. An $i^{th}$ measurement signal of the N measurement signals is supplied to an $i^{th}$ amplifier arrangement of the at least N+1 amplifier arrangements. Measurement values produced by the $i^{th}$ amplifier arrangement from the $i^{th}$ measurement signal are outputted. At least two $i^{th}$ reference signals are supplied to a further amplifier arrangement of the at least N+1 amplifier arrangements. The further amplifier arrangement is calibrated with the aid of the at least two $i^{th}$ reference signals, whereby a zero point error and an amplification error of the further amplifier arrangement are determined. The further amplifier arrangement is adjusted if at least one of the errors determined for it lies above a prescribed threshold value for this error. The $i^{th}$ measurement signal is supplied to the further amplifier arrangement. Measurement values produced by the further amplifier arrangement from the $i^{th}$ measurement signal are outputted. At least two reference signals are supplied to the $i^{th}$ amplifier arrangement. The $i^{th}$ amplifier arrangement is calibrated with the aid of the at least two reference signals, whereby a zero point error and an amplification error of the $i^{th}$ amplifier arrangement are determined. The $i^{th}$ amplifier arrangement is adjusted if at least one of the errors determined for it lies above the prescribed threshold value for this error.

With the calibrating and adjusting method each amplifier arrangement is directly calibrated. In that regard, calibrating is performed each time respectively with the aid of reference signals, which for example can represent a zero point and an end point, and thereby both the zero point error as well as the amplification error are correctly determined. This applies even for a quasi-statically varying measurement signal.

In contrast to the method described in the EP 2 056 460 B1, in the calibration of the amplifier arrangements, the correction values are respectively not "learned" by means of an indirect calibration, but rather are calculated by a direct calibration. Thus, here it does not give rise to an error propagation, that is to say, no follow-on or secondary errors, and no measuring errors necessitated thereby, arise. In other words, no errors arise, which add or sum with one another. Thus, the calibrating and adjusting method provides the maximum accuracy, which heretofore was only achievable in a classic calibration with interruption of the measurement. Thus, interruptions can be avoided and simultaneously the high accuracy requirements specified for a precision measuring amplifier can be satisfied.

Moreover, generally only one additional amplifier arrangement per measuring amplifier is necessary for realizing the calibrating and adjusting method, that is to say only N+1 amplifier arrangements instead of 2×N amplifier arrangements are necessary. In multi-channel measuring amplifiers, this reduces the hardware complexity and cost, the space requirement, the energy consumption, and the production costs. This especially comes to the fore in precision measuring amplifiers, because in this regard a considerably higher circuit complexity and cost is required for each amplifier arrangement.

According to a second aspect of the invention, the further amplifier arrangement is an $(N+j)^{th}$ amplifier arrangement of the at least N+1 amplifier arrangements, wherein j≥1 applies. For calibrating the $i^{th}$ amplifier arrangement, the at least two $i^{th}$ reference signals are utilized. And after the step of adjusting the $i^{th}$ amplifier arrangement, once again the $i^{th}$ measurement signal is supplied to the $i^{th}$ amplifier arrangement and the measurement values produced by it are outputted.

In this manner, after the calibration of the amplifier arrangement, the measurement signal that was previously already supplied to it is again supplied to it. Before this takes place, it is completely removed from the measuring path and can therefore be calibrated with high accuracy. Especially, even with a quasi-statically varying measurement signal, both the zero point error as well as the amplification error can be reliably determined.

According to a third aspect of the invention, j≥1 applies. For i=1, the further amplifier arrangement is an $(N+j)^{th}$ amplifier arrangement of the at least N+1 amplifier arrangements, at least two $(i+1)^{th}$ reference signals are utilized for calibrating the $i^{th}$ amplifier arrangement, and after the step of adjusting the $i^{th}$ amplifier arrangement, a measurement signal of the N measurement signals that was previously supplied to an $(i+1)^{th}$ amplifier arrangement of the at least N+1 amplifier arrangements is supplied to the $i^{th}$ amplifier arrangement, and measurement values produced by the $i^{th}$ amplifier arrangement from this measurement signal are outputted. For 1<i<N, the further amplifier arrangement is an $(i-1)^{th}$ amplifier arrangement of the at least N+1 amplifier arrangements, at least two $(i+1)^{th}$ reference signals are utilized for calibrating the $i^{th}$ amplifier arrangement, and after the step of adjusting the $i^{th}$ amplifier arrangement, a measurement signal of the N measurement signals that was previously supplied to an $(i+1)^{th}$ amplifier arrangement of the at least N+1 amplifier arrangements is supplied to the $i^{th}$ amplifier arrangement, and measurement values produced by the $i^{th}$ amplifier arrangement from this measurement signal are outputted. For i=N, the further amplifier arrangement is an $(i-1)^{th}$ amplifier arrangement of the at least N+1 amplifier arrangements, at least two $(N+j)^{th}$ reference signals are utilized for calibrating the $i^{th}$ amplifier arrangement, and after the step of adjusting the $i^{th}$ amplifier arrangement, a measurement signal of the N measurement signals that was previously supplied to the $(N+j)^{th}$ amplifier arrangement of the at least N+1 amplifier arrangements is supplied to the $i^{th}$ amplifier arrangement, and measurement values produced by the $i^{th}$ amplifier arrangement from this measurement signal are outputted.

After a calibration, there is no longer a need to switch back. Therefore, it is possible that the amplifier arrangements can rotate, that is to say that after the calibration or adjustment of an amplifier arrangement, the channel that has been "shifted" to a further amplifier arrangement for carrying out this calibration or adjustment, can remain there and the just-calibrated amplifier arrangement serves as a replacement for a next amplifier arrangement to be calibrated. In this manner, the method can be accelerated through a halving of the number of the calibration processes.

According to a fourth aspect of the invention, the measuring amplifier comprises at least 2×N amplifier arrangements. The further amplifier arrangement is an $(i+N)^{th}$ amplifier arrangement of the at least 2×N amplifier arrangements. The at least two $i^{th}$ reference signals are utilized for calibrating the $i^{th}$ amplifier arrangement. And after the step of adjusting the $i^{th}$ amplifier arrangement, once again the $i^{th}$ measurement signal is supplied to the $i^{th}$ amplifier arrangement and the measurement values produced by it are outputted.

Here it is true that the hardware complexity or expenditure is somewhat higher. However in exchange for this, the calibrating and adjusting method on the one hand can also be utilized for measuring amplifiers with galvanically separated or isolated channels, and can further operate with high accuracy. On the other hand, the presence of an additional amplifier arrangement for each individual channel makes it possible to carry out the calibration and adjustment for several channels simultaneously, and thus to carry out the calibrating and adjusting method with a higher frequency or a shorter cycle time. This can increase the accuracy still further.

According to a fifth aspect of the invention, the amplifier arrangements of the measuring amplifier respectively each comprise at least one filter. After the step of supplying the $i^{th}$ measurement signal to the further amplifier arrangement and before the step of outputting the measurement values that are produced by the further amplifier arrangement from the $i^{th}$ measurement signal, the method waits until the at least one filter of the further amplifier arrangement has stabilized after its start-up transient. And after a step of supplying, to the $i^{th}$ amplifier arrangement, a different measurement signal of the N measurement signals that was previously supplied to a different amplifier arrangement of the at least N+1 amplifier arrangements, and before a step of outputting measurement values produced by the $i^{th}$ amplifier arrangement from the different measurement signal, the method waits until the at least one filter of the $i^{th}$ amplifier arrangement has stabilized after its start-up transient.

Upon switching over to an alternative amplifier arrangement and m back again, each time respectively the method waits until a filter or several filters, which may be analog or digital filters, of the respective target amplifier arrangement are fully stabilized after the start-up transient. Thereby, respectively a shock-free or surge-free takeover of the measuring task from an initial amplifier arrangement by the target amplifier arrangement is possible. A jump or step is apparent only in the noise, but the average value corresponds.

According to a sixth aspect of the invention, the amplifier arrangements of the measuring amplifier each respectively comprise at least one digital filter. After the step of supplying the $i^{th}$ measurement signal to the further amplifier arrangement, and before the step of outputting the measurement values produced by the further amplifier arrangement from the $i^{th}$ measurement signal, a step of copying filter coefficients and status or state memories of the at least one digital filter of the $i^{th}$ amplifier arrangement to the at least one digital filter of the further amplifier arrangement is carried out. And after a step of supplying, to the $i^{th}$ amplifier arrangement, a different measurement signal of the N measurement signals that was previously supplied to a different amplifier arrangement of the at least N+1 amplifier arrangements, and before a step of outputting measurement values produced by the $i^{th}$ amplifier arrangement from the different measurement signal, a step of copying filter coefficients and status or state memories of the at least one digital filter of the different amplifier arrangement to the at least one digital filter of the $i^{th}$ amplifier arrangement is carried out.

With very slow digital filters, which are necessary especially for precision measurements, in order to achieve the required high resolution, filter start-up transient times of several seconds or even minutes are necessary. In order to eliminate these start-up transient times, not only the filter coefficients but also the status or state memories of the digital filters of an initial amplifier arrangement are copied to a target amplifier arrangement. Then, beginning with the next measurement value, the measurement values of the target amplifier arrangement are outputted, that is to say the measuring task of the initial amplifier arrangement is taken over by it. Thereby, the digital filters of the target amplifier arrangement are pre-loaded or pre-charged with the correct values and the start-up transient times are eliminated. Moreover, in this manner, a transition or take-over without a jump or step in the noise is also possible, because both the filter coefficients as well as the status or state memories of the digital filters of both amplifier arrangements correspond with one another at the time point of the transition or take-over.

According to a seventh aspect of the invention, after the step of supplying the $i^{th}$ measurement signal to the further amplifier arrangement, and before the step of outputting measurement values produced by the further amplifier arrangement from the $i^{th}$ measurement signal, a step of correcting a difference of the intrinsic errors of the $i^{th}$ amplifier arrangement and of the further amplifier arrangement is carried out. And after a step of supplying, to the $i^{th}$ amplifier arrangement, a different measurement signal of the N measurement signals that was previously supplied to a different amplifier arrangement of the at least N+1 amplifier arrangements, and before a step of outputting measurement values produced by the $i^{th}$ amplifier arrangement from the different measurement signal, a step of correcting a difference of the intrinsic errors of the different amplifier arrangement and of the $i^{th}$ amplifier arrangement is carried out.

Even a minimal difference of the intrinsic errors of initial amplifier arrangement and target amplifier arrangement in the operating point, such as e.g. the linearity error, is still corrected, whereby the switch-over to the respective other amplifier arrangement takes place completely undetectably.

According to an eighth aspect of the invention, all steps are cyclically repeated, in order to calibrate the measuring amplifier automatically in prescribed time intervals, and to adjust the measuring amplifier when necessary.

Through the cyclical repetition of the steps of the calibrating method and the adjusting method, especially for a precision measuring amplifier, the high class accuracy of the measuring amplifier can be maintained constant over its operating time.

According to a ninth aspect of the invention, a measuring amplifier for carrying out a method according to one of the preceding aspects of the invention comprises the following features: the at least N+1 amplifier arrangements, which respectively comprise an amplifier circuit, an analog-digital converter and a digital signal processing unit with at least one digital filter, at least N+1 switches, which are respectively allocated to one of the N+1 amplifier arrangements, at least one reference signal generating arrangement and at least one selection arrangement. Each amplifier arrangement of the N+1 amplifier arrangements is calibratable and adjustable with the aid of reference signals generated or produced by the at least one reference signal generating arrangement. One amplifier arrangement of the at least N+1 amplifier arrangements is switchable or circuit-connectable parallel to each one of the other amplifier arrangements, each amplifier arrangement of the at least N+1 amplifier arrangements is respectively switchable or circuit-connectable parallel to each one of the other amplifier arrangements, or each amplifier arrangement of the at least N+1 amplifier arrangements is switchable or circuit-connectable parallel to exactly one other amplifier arrangement. The respective switching-over is able to be carried out via corresponding switches of the at least N+1 switches. The at least one selection arrangement is configured for outputting N measurement values, which correspond to the N measurement signals.

Regarding the measuring amplifier, each amplifier arrangement can be directly calibrated with the aid of reference signals. Thereby, even for a measurement signal that changes or varies quasi-statically, both the zero point error as well as the amplification error can be correctly determined, and it also does not lead to an error propagation. It is thus possible to achieve the maximal accuracy and nonetheless to avoid interruptions of the measuring operation. For this, generally only one additional amplifier arrangement is necessary, even in a multi-channel measuring amplifier.

According to a tenth aspect of the invention, a measuring system encompasses a measuring amplifier according to the ninth aspect and at least one measuring transducer, which is configured for supplying the N measurement signals to the measuring amplifier.

The measuring system comprises the advantages that are already described above in connection with the measuring amplifier or respectively the calibrating and adjusting method carried out by it.

BRIEF DESCRIPTION OF THE DRAWINGS

In the following, the invention is described in further detail with reference to example embodiments in connection with schematic drawings. It is shown by.

DETAILED DESCRIPTION OF EXAMPLE EMBODIMENIS OF THE INVENTION

Figure 1:
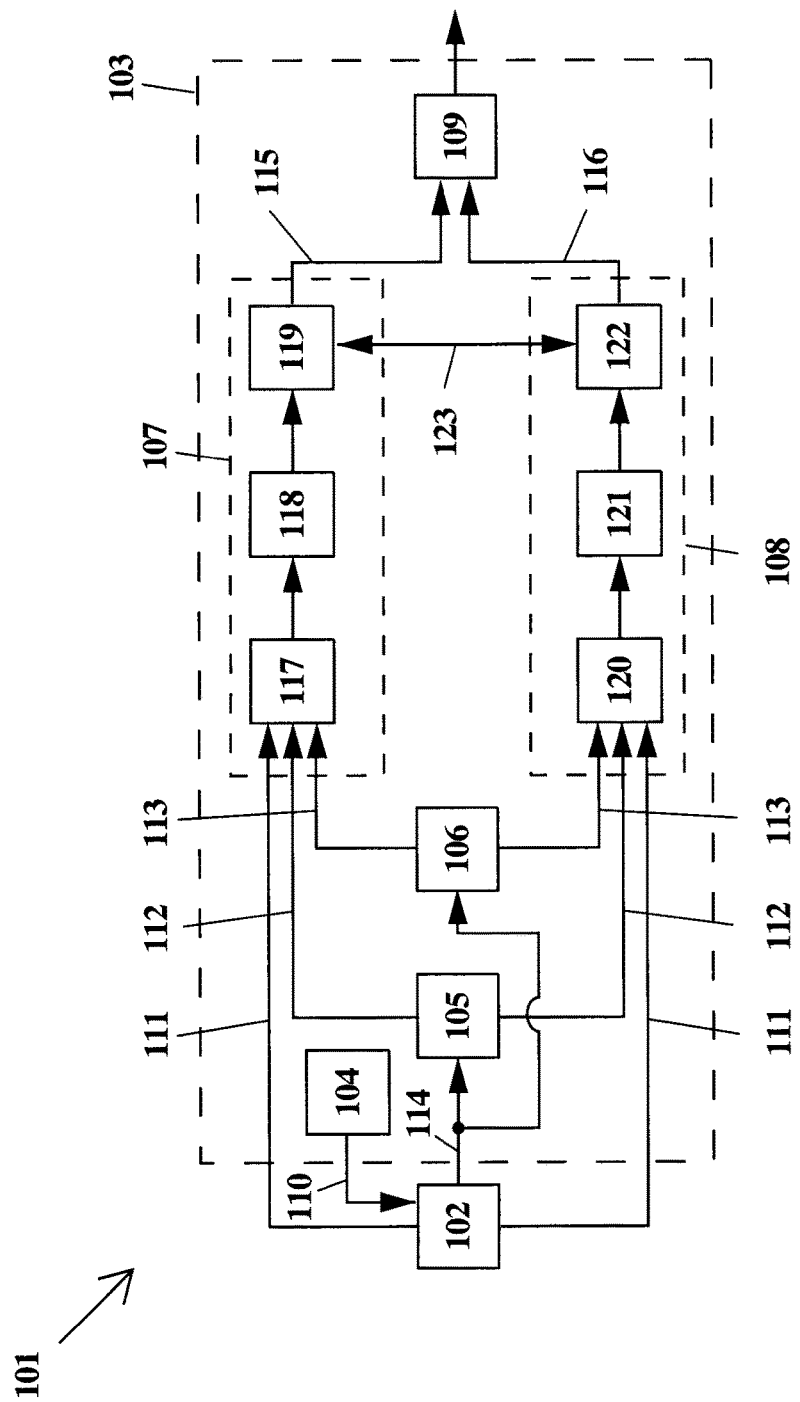
FIG. 1 a simplified block circuit diagram of a measuring system 101 according to a first example embodiment.

FIG. 1 shows the simplified block circuit diagram of the measuring system 101 according to the first example embodiment, in which not every detail is illustrated for the sake of clarity of overview. The measuring system 101 comprises a measuring transducer 102 and a measuring amplifier 103 with one channel and a class accuracy of e.g. 0.0005%.

The measuring transducer 102 can involve a transducer or pick-up for a mechanical quantity or value such as, for example, force, weight, torque or pressure, which converts or transforms the value into an electrical signal, e.g. through the use of strain transducers such as strain gages for example, which are circuit-connected together with one another in a Wheatstone bridge circuit, or also a different type of transducer.

The measuring amplifier 103 encompasses a voltage source 104, a first reference signal generating arrangement 105, a second reference signal generating arrangement 106, an additional amplifier arrangement 107, a first amplifier arrangement 108 and a selection arrangement 109.

A supply voltage 110 produced by the voltage source 104 is supplied to the measuring transducer 102. This converts or transforms a measured quantity or value into a first measurement signal 111, which is supplied to the measuring amplifier 103 or intermittently to the additional amplifier arrangement 107 and intermittently to the first amplifier arrangement 108. A first reference signal 112 produced by the first reference signal generating arrangement 105 and a second reference signal 113 produced by the second reference signal generating arrangement 106 are similarly supplied intermittently to the additional amplifier arrangement 107 and intermittently to the first amplifier arrangement 108. This is explained in further detail below.

The first reference signal generating arrangement 105 and the second reference signal generating arrangement 106 are supplied with a voltage 114 that is fed back from the measuring transducer 102, in order to be able to take conductor or transmission losses into account.

The selection arrangement 109 can involve, for example, a multiplexer or a different type of selection circuit. With its help, either measurement values 115 produced by the additional amplifier arrangement 107 from the first measurement signal 111, or measurement values 116 produced by the first amplifier arrangement 108 from the first measurement signal 111 are selected and outputted, that is to say for example supplied to an output arrangement or device, such as e.g. a display, which is not shown in FIG. 1.

The additional amplifier arrangement 107 encompasses an additional amplifier circuit 117, an additional analog-digital converter 118 and an additional digital signal processing unit 119. The additional amplifier circuit 117 comprises an amplifier and can encompass further elements such as for example a demodulator and an analog filter, such as e.g. a low pass filter, which is not shown in detail in FIG. 1. The additional digital signal processing unit 119 can be used for various different calculations and comprises a digital filter or several digital filters, whereby no such filter is shown in FIG. 1.

The first amplifier arrangement 108 is constructed in the same type and manner as the additional amplifier arrangement 107 and encompasses a first amplifier circuit 120, a first analog-digital converter 121 and a first digital signal processing unit 122. The first amplifier circuit 120 comprises an amplifier and can encompass further elements such as for example a demodulator and an analog filter, such as e.g. a low pass filter, which is not shown in detail in FIG. 1. The first digital signal processing unit 122 can be used for various different calculations, and comprises a digital filter or several digital filters, whereby no such filter is shown in FIG. 1.

The additional digital signal processing unit 119 and the first digital signal processing unit 122 can involve, for example, digital signal processors.

The digital filters in the first digital signal processing unit 122 and the additional digital signal processing unit 119 respectively comprise filter coefficients and status or state memories. In that regard, as explained in further detail below and illustrated by a double-headed arrow 123 in FIG. 1, the filter coefficients and the status or state memories or the state memory contents of the digital filters of the first digital signal processing unit 122 can be copied to the corresponding digital filters of the additional digital signal processing unit 119, and vice versa.

The progression of the background calibration and background adjustment or interruption-free calibration and adjustment is represented in the measuring amplifier 103 according to the first example embodiment with only one channel and two internal amplifier arrangements 107 and 108 as follows.

At first, the first amplifier arrangement 108 is located in the measuring branch or measuring path. The first measurement signal 111 is supplied to it, and it amplifies, digitizes and processes the same. The measurement values 116 thereby produced from the first measurement signal 111 are outputted via the selection arrangement 109.

Now the first reference signal 112 from the first reference signal generating arrangement 105, which e.g. can represent a zero value of the first measurement signal 111, and the second reference signal 113 from the second reference signal generating arrangement 106, which e.g. can represent an end value of the first measurement signal 111, are supplied to the additional amplifier arrangement 107. It is calibrated with these reference signals, whereby a zero point error and an amplification error of the additional amplifier arrangement 107 are determined. These error values or corresponding correction values can be calculated in the additional digital signal processing unit 119 and with a higher accuracy than the class accuracy of the measuring amplifier 103. If the zero point error lies above a prescribed threshold value for the zero point error and/or the amplification error lies above a prescribed threshold value for the amplification error, that is to say one of the error values lies outside of a prescribed tolerance, then the additional amplifier arrangement 107 is adjusted based on the determined values.

Because the errors of the additional amplifier arrangement 107 have now been calibrated-out or adjusted-out, now the first measurement signal 111 can be additionally connected to it in parallel at the input via at least one switch that is allocated to the additional amplifier arrangement 107 and not shown in FIG. 1, that is to say the additional amplifier arrangement 107 can be switched or circuit-connected parallel to the first amplifier arrangement 108 by means of the at least one switch, and the first measurement signal 111 can be supplied to it. Thereupon the two amplifier arrangements 107 and 108 simultaneously process the identical useful signal after a start-up transient of their filters. Once the additional amplifier arrangement 107 is stabilized after its start-up transient, that is to say a start-up transient time has elapsed, then the measurement values 115 thereof are outputted.

In other words, the first measurement signal 111 is supplied to the additional amplifier arrangement 107 and it amplifies, digitizes and processes the same. After the start-up transient of its filters, then the measurement values 115 produced by it from the first measurement signal 111 are outputted via the selection arrangement 109. In that regard, the switching-over, by the selection arrangement 109, to the outputting of the measurement values 115 produced by the additional amplifier arrangement 107 from the first measurement signal 111, takes place in such a manner so that it is not perceptible by a user. A minimal difference of the intrinsic errors of the two amplifier arrangements 107 and 108 at the operating point, such as e.g. the linearity error, is additionally corrected.

The first amplifier arrangement 108 is now no longer taking part in the measurement and can be removed or separated out of the measuring path by means of at least one switch that is allocated to the first amplifier arrangement 108 and not shown in FIG. 1. As soon as this has occurred, it can be directly classically calibrated with at least two reference signals, e.g. zero value and end value. In this time interval, the additional amplifier arrangement 107 takes over the measuring task of the first amplifier arrangement 108 with an accuracy that remains constant.

In other words, now the first reference signal 112 from the first reference signal generating arrangement 105, which e.g. can represent a zero value of the first measurement signal 111, and the second reference signal 113 from the second reference signal generating arrangement 106, which can e.g. represent an end value of the first measurement signal 111, are supplied to the first amplifier arrangement 108 with the aid of the at least one switch allocated thereto. It is calibrated with these reference signals, whereby a zero point error and an amplification error of the first amplifier arrangement 108 are determined. These error values or corresponding correction values can be calculated in the first digital signal processing unit 122 and with a higher accuracy than the class accuracy of the measuring amplifier 103. If the zero point error lies above a prescribed threshold value for the zero point error and/or the amplification error lies above a prescribed threshold value for the amplification error, that is to say one of the error values lies outside of a prescribed tolerance, then the first amplifier arrangement 108 is adjusted based on the determined values.

In contrast to the method described in the EP 2 056 460 B1, in the calibration of the two amplifier arrangements 107 and 108, the correction values are respectively not "learned" by means of an indirect calibration, but rather are calculated by a direct calibration. Thus, hereby it does not lead to an error propagation, that is to say no follow-on or secondary errors and no measurement errors necessitated thereby arise.

After the errors of the first amplifier arrangement 108 have now been calibrated-out or adjusted-out, then it is again switched back into the measuring path by means of the at least one switch allocated to it. Thereupon, after the start-up transient time, the measurement values 116 produced by it from the first measurement signal 111 are again outputted via the selection arrangement 109. In that regard, the switching-over, by the selection arrangement 109, to the outputting of the measurement values 116 produced by the first amplifier arrangement 108 from the first measurement signal 111, takes place in such a manner so that it is not perceptible by a user. A minimal difference of the intrinsic errors of the two amplifier arrangements 107 and 108 at the operating point, such as e.g. the linearity error, is additionally corrected.

Beginning at this time point, the additional amplifier arrangement 107 is no longer taking part in the measurement and can be removed or separated out of the measuring path with the aid of the at least one switch allocated to it. Thereby the original condition is again achieved.

In that regard, the calibration or adjustment of the first amplifier arrangement 108 and its subsequent return-switching into the measuring path do not need to be carried out directly after the taking-over of the measuring task of the first amplifier arrangement 108 by the additional amplifier arrangement 107. That can also wait until the next turn-by-turn calibration or adjustment is imminent, and until then the additional amplifier arrangement 107 can remain in the measuring path. In this manner, the number of the calibration processes can be halved and the method can be accelerated.

After a fixedly defined interval, the cycle is initiated anew. During the remaining time of the interval, the additional amplifier arrangement 107 or also the first amplifier arrangement 108 is not in use. This offers the possibility, in a measuring amplifier with more than one channel, that this amplifier arrangement that is currently not being used, can be utilized for the bridging-over for the calibration in other channels, as will be explained below in connection with the second and the third example embodiment. If the channels are not galvanically separated or isolated, thereby only one additional amplifier arrangement per measuring amplifier is needed for realizing the calibrating and adjusting method. In multi-channel measuring amplifiers, this reduces the hardware complexity and expenditure, the space requirement, the energy consumption and the production costs. This especially comes to the fore in precision measuring amplifiers, because here a considerably higher circuit complexity or expenditure is necessary for each amplifier arrangement.

For taking-over the measuring task by a target amplifier arrangement, it must respectively be ensured that the digital filters of the target amplifier arrangement are completely stable after the start-up transient. This is necessary in the switch-over in both directions (to and from an additional amplifier arrangement). Only then is a shock-free or surge-free take-over possible. A jump or step is apparent only in the noise, but the average value corresponds.

With very slow digital filters, which are necessary especially for precision measurements, in order to achieve the very high resolution, however filter start-up transient times of several seconds or even minutes are necessary. In order to eliminate these start-up transient times, not only the filter coefficients but also the status or state memories or rather the state memory contents of the digital filters of an initial amplifier arrangement can be copied to the target amplifier arrangement. Then, beginning with the next measurement value, the measurement values of the target amplifier arrangement are outputted, that is to say the measuring task of the initial amplifier arrangement is taken over by it. Thereby, the digital filters of the target amplifier arrangement are pre-loaded or pre-charged with the correct values and the start-up transient times are eliminated. Moreover, in this manner, a transition or take-over without a jump or step in the noise is also possible, because both the filter coefficients as well as the status or state memories of the digital filters of both amplifier arrangements correspond with one another at the time point of the transition or take-over.

The principle of the filter charge transfer is applicable generally and also in the example embodiments described hereafter. The present first example embodiment begins from the measuring amplifier 103 with only one channel and two amplifier arrangements 107 and 108, so that here the filter coefficients and state memories or state memory contents of the first amplifier arrangement 108 are copied to the additional amplifier arrangement 107, and vice versa. Stated more exactly, the filter coefficients and state memories or state memory contents of the digital filters of the first digital signal processing unit 102 are copied to the corresponding digital filters of the additional digital signal processing unit 119, and vice versa. In this manner, the filters are respectively "copied" into stable operation instead of transiently oscillating into stable operation. Thereby it is not necessary, as described above, to first wait until the start-up transient time has elapsed, when switching over to the respective other amplifier arrangement.

While two reference signal generating arrangements are illustrated in FIG. 1, also more than two reference signal generating arrangements can be provided, or several reference signals can be produced by one single reference signal generating arrangement. Respectively at least two different reference signals or reference values, such as for example zero value and end value, must simply be available for the calibration, so that both the zero point error as well as the amplification error can be determined.

As described above, at least one switch is allocated to each one of the amplifier arrangements 107 and 108, via which switch the first measurement signal 111 can be supplied to the respective amplifier arrangement. When the first measurement signal 111 is not supplied to the respective amplifier arrangement, then the first reference signal 112 or the second reference signal 113 can be supplied to it via this at least one switch. Correspondingly, e.g. one switch can be provided for the switched supplying of the first measurement signal 111, one switch can be provided for the switched supplying of the first reference signal 112, and one switch can be provided for the switched supplying of the second reference signal 113. A multiplexer or a different type of selection circuit can also be provided as the switch with several switch positions, in order to selectively switchedly supply the first measurement signal 111, the first reference signal 112 or the second reference signal 113. Further variants are possible.

The same considerations apply for a measuring amplifier with more than one channel, as described hereafter. Generally, in a measuring amplifier with N channels and correspondingly at least N+1 amplifier arrangements, also at least N+1 switches are provided, which are respectively allocated to one of the N+1 amplifier arrangements, in order to switch over between a measurement signal or several measurement signals and at least two reference signals. In that regard, the switches are not necessarily provided as individual components. They can also be realized in another manner, such as e.g. in the form of an integrated circuit.

The entire sequence or progression described above can be controlled by a central control device such as for example a microprocessor or another type of controller. For the sake of clarity of overview, the illustration of such an element was omitted in FIG. 1 as well as in FIG. 2 and FIG. 3.

Figure 2:
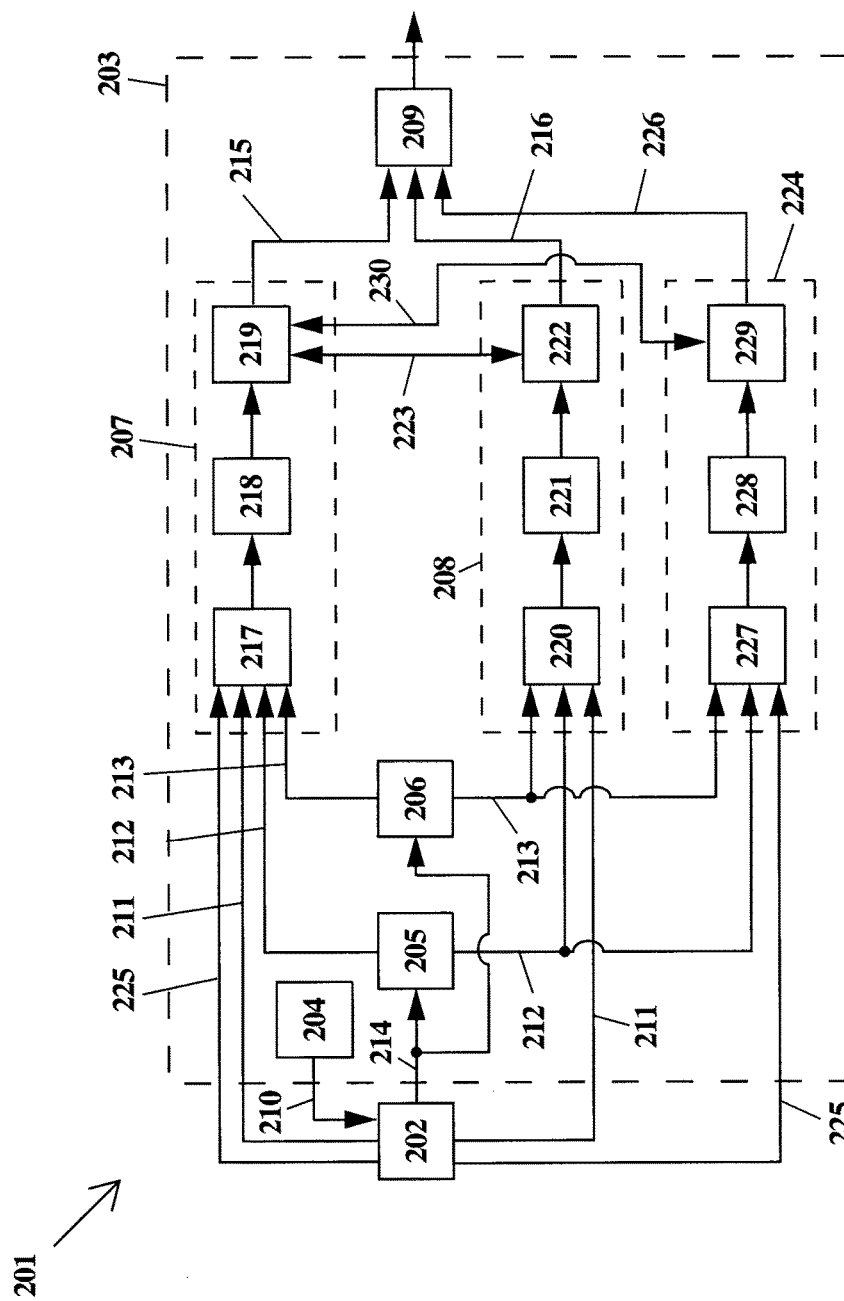
FIG. 2 a simplified block circuit diagram of a measuring system 201 according to a second example embodiment.

FIG. 2 shows the simplified block circuit diagram of the measuring system 201 according to the second example embodiment, in which not every detail is illustrated for the sake of clarity of overview.

Except for the modifications explained hereafter, the elements 202 to 223 correspond to the elements 102 to 123 described in connection with the first example embodiment. However, the measuring amplifier 203 comprises two channels and correspondingly a second amplifier arrangement 224, in order to be able to process not only the first measurement signal 211 but also a second measurement signal 225. Correspondingly, the block referenced with the reference number 202 in the simplified block circuit diagram of FIG. 2 also represents two measuring transducers. The second measurement signal 225, similarly like the first measurement signal 211, is produced by converting or transforming a measured quantity or value in the corresponding measuring transducer and is supplied to the measuring amplifier 203, or rather intermittently to the additional amplifier arrangement 207 and intermittently to the second amplifier arrangement 224.

The voltage source 204 can supply the same supply voltage to the two measuring transducers illustrated by the block 202. Alternatively, the block referenced with the reference number 204 in the simplified block circuit diagram according to FIG. 2 can also represent two voltage sources, and correspondingly the arrow provided with the reference number 210 can illustrate two different supply voltages for the two measuring transducers.

Depending on which channel of the measuring amplifier 203 is to be calibrated at a given time, the first reference signal generating arrangement 205 and the second reference signal generating arrangement 206 are respectively supplied with a voltage fed back from the corresponding measuring transducer, in order to be able to take conductor or transmission losses into account. The arrow provided with the reference number 214 in the simplified block circuit diagram of FIG. 2 thus represents two fed-back voltages.

In order to be able to calibrate the second amplifier arrangement 224 similarly like the amplifier arrangements 207 and 208, the first reference signal 212 produced by the first reference signal generating arrangement 205 and the second reference signal 213 produced by the second reference signal generating arrangement 206 are also supplied intermittently to it. As already explained above, more than two reference signal generating arrangements can also be provided, or several reference signals can be produced by a single reference signal generating arrangement. At least two different reference signals or reference values, such as for example zero value and end value, must simply be available for each calibration, so that both the zero point error as well as the amplification error can be determined.

The second amplifier arrangement 224 outputs measurement values 226 produced by it from the second measurement signal 225. It is constructed in the same type and manner as the additional amplifier arrangement 207 and the first amplifier arrangement 208, and encompasses a second amplifier circuit 227, a second analog-digital converter 228 and a second digital signal processing unit 229. The second amplifier circuit 227 comprises an amplifier and can encompass further elements such as for example a demodulator and an analog filter such as e.g. a low pass filter, which is not shown in detail in FIG. 2. The second digital signal processing unit 229 can be used for various calculations and comprises a digital filter or several digital filters, whereby no such filter is illustrated in FIG. 2.

The selection arrangement 209 is constructed so that it outputs both measurement values corresponding to the first measurement signal 211 as well as measurement values corresponding to the second measurement signal 225. Correspondingly, the measurement values 216 and 226, or in the case when a calibration is just being carried out and the additional amplifier arrangement 207 replaces one of the two amplifier arrangements 208 and 224, the measurement values 215 and the measurement values of the not-replaced amplifier arrangement, that is to say either the measurement values 216 or the measurement values 226, are outputted.

The sequence or progression of the background calibration and adjustment or the interruption-free calibration and adjustment is represented as follows, for the measuring amplifier 203 according to the second example embodiment with two channels and three internal amplifier arrangements 207, 208 and 224.

At first the first amplifier arrangement 208 is located in the measuring branch or measuring path. The first measurement signal 211 is supplied to it, and it amplifies, digitizes and processes the same. The measurement values 216 that are thereby produced from the first measurement signal 211 are outputted via the selection arrangement 209.

Now the additional amplifier arrangement 207 is calibrated and if necessary adjusted. For this, the first reference signal 212 and the second reference signal 213 are used, which in this case may represent e.g. a zero value and an end value of the first measurement signal 211. When the errors of the additional amplifier arrangement 207 have been calibrated-out or adjusted-out, then the first measurement signal 211 is supplied to it and it amplifies, digitizes and processes the same. After oscillating-in through the start-up transient or "copying-in" of its filters, then the measurement values 215 produced by it from the first measurement signal 211 are outputted via the selection arrangement 209.

The first amplifier arrangement 208 is now no longer taking part in the measurement, and can be removed from the measuring path. As soon as this has occurred, the first amplifier arrangement 208 is calibrated and if necessary adjusted, whereby once again the reference signals 212 and 213, which e.g. represent a zero value and an end value of the first measurement signal 211, are used. In this time period, the additional amplifier arrangement 207 takes over the measuring task of the first amplifier arrangement 208, with an accuracy that remains constant. After the errors of the first amplifier arrangement 208 have been calibrated-out or adjusted-out, then it is switched back into the measuring path. After oscillating-in through the start-up transient or "copying-in" its filters, once again the measurement values 216 produced by it from the first measurement signal 211 are outputted via the selection arrangement 209.

Beginning at this time point, the additional amplifier arrangement 207 is no longer taking part in the measurement, and is removed from the measuring path. It can now be used for replacing a further amplifier arrangement, in this case the second amplifier arrangement 224.

The additional amplifier arrangement 207 is now once again calibrated and if necessary adjusted. For this, the first reference signal 212 and the second reference signal 213 or further reference signals that are not illustrated in the simplified block circuit diagram according to FIG. 2, are used, which are now produced with the use of the voltage that is fed back from the second measuring transducer that supplies the second measurement signal 225, and which can represent e.g. a zero value and an end value of the second measurement signal 225. When the errors of the additional amplifier arrangement 207 have been calibrated-out or adjusted-out, then the second measurement signal 225 is supplied to it and it amplifies, digitizes and processes the same. After oscillating-in through the start-up transient or "copying-in" its filters, then the measurement values 215 produced by it from the second measurement signal 225 are outputted via the selection arrangement 209.

The second amplifier arrangement 224 is now no longer taking part in the measurement and can be removed from the measuring path. As soon as this has occurred, the second amplifier arrangement 224 is calibrated and if necessary adjusted, whereby once again the reference signals 212 and 213 representing e.g. a zero value and an end value of the second measurement signal 225, or further reference signals, are used. In this time period the additional amplifier arrangement 207, with an accuracy that remains constant, takes over the measuring task of the second amplifier arrangement 224. After the errors of the second amplifier arrangement 224 have been calibrated-out or adjusted-out, this is switched back into the measuring path. After oscillating-in through the start-up transient or "copying-in" its filters, then the measurement values 226 produced by it from the second measurement signal 225 are outputted via the selection arrangement 209.

Beginning at this time point, the additional amplifier arrangement 207 is no longer taking part in the measurement and is removed from the measuring path. Thus the original state has again been achieved.

In the above, the sequence or progression is not described with as much detail as for the first example embodiment. For further details, reference is made to the description of the first example embodiment, wherein the explanations to be found there with respect to the first amplifier arrangement 108 apply not only to the first amplifier arrangement 208 but also to the second amplifier arrangement 224 in a corresponding manner.

The explanations in connection with the first example embodiment with respect to the filter charge transfer for elimination of the filter start-up transient times also apply for the second example embodiment and especially for the second amplifier arrangement 224. The fact that also the filter coefficients and the state memories or the state memory contents of the second amplifier arrangement 224 or of the digital filters of the second digital signal processing unit 229 can be copied to the additional amplifier arrangements 207 or the corresponding digital filters of the additional digital signal processing unit 219, and vice versa, is illustrated in FIG. 2 by the double-headed arrow 230.

The explanations with respect to the switch-over time points of the switches used for the switching-over, the cyclical repetition of the sequence or progression, and a few possible variants in connection with the first example embodiment similarly apply for the second example embodiment.

Figure 3:
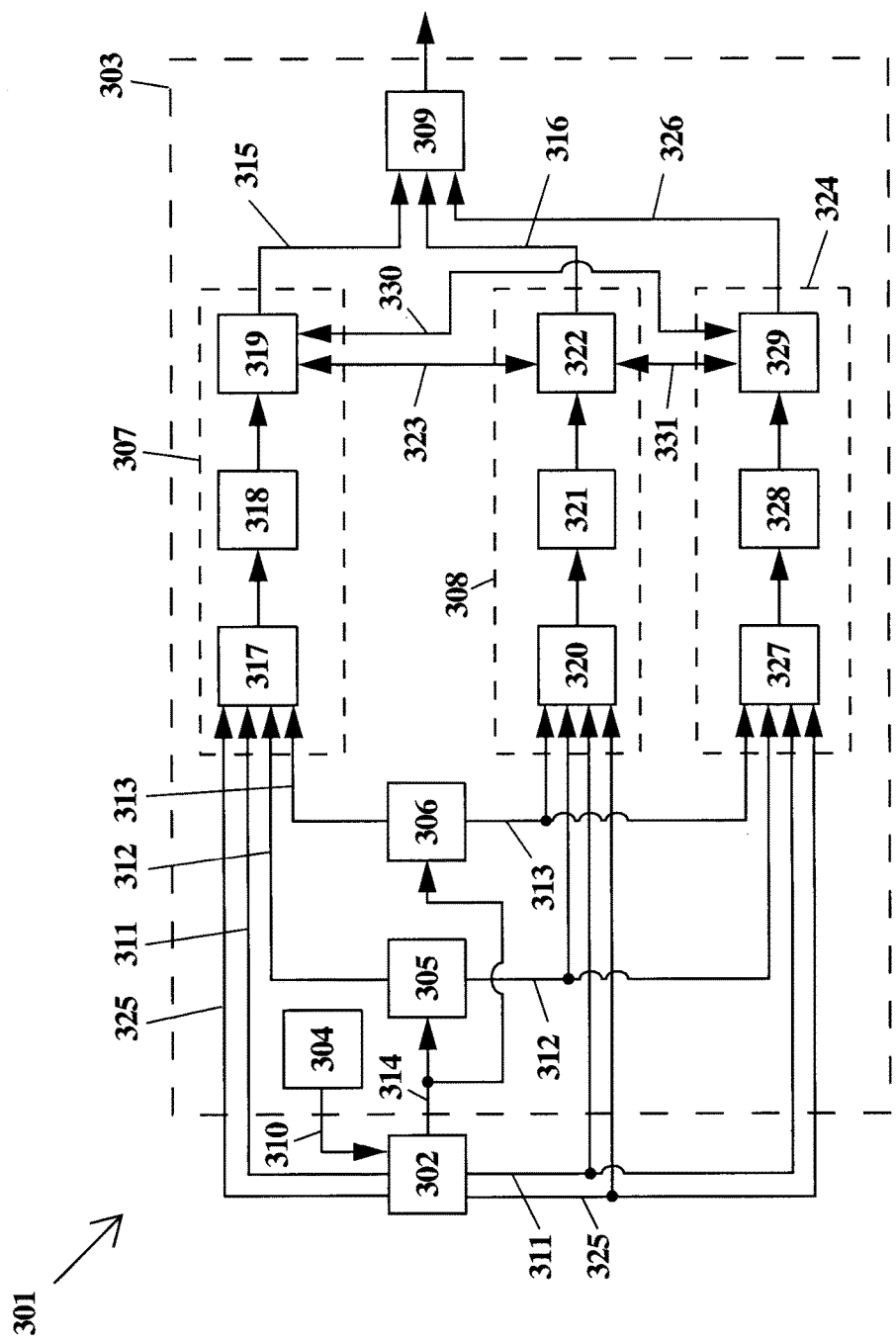
FIG. 3 a simplified block circuit diagram of a measuring system 301 according to a third example embodiment.

FIG. 3 shows the simplified block circuit diagram of the measuring system 301 according to the third example embodiment, in which not every detail is illustrated for the sake of clarity of overview.

The third example embodiment builds upon the second example embodiment. This involves a variant in which generally not only the additional amplifier arrangement can be switched or circuit-connected in parallel, but rather each amplifier arrangement can be switched or circuit-connected in parallel with each other amplifier arrangement. This has the advantage that it is no longer necessary to switch back after a calibration. Through this modification it is possible that the amplifier arrangements can rotate, that is to say that after the calibration or adjustment of one amplifier arrangement, the channel that was "shifted" to a further amplifier arrangement for this remains there, and the just-calibrated amplifier arrangement serves as a replacement for an amplifier arrangement that is next to be calibrated. In this manner the method can be accelerated through a halving of the number of the calibration processes.

The elements 302 to 330 correspond to the elements 202 to 230 described in connection with the second example embodiment, except for the modifications explained in the following.

In the third example embodiment with three internal amplifier arrangements, the previously explained variant concretely means that not only the additional amplifier arrangement 307 can be switched or circuit-connected parallel to the first amplifier arrangement 308 or the second amplifier arrangement 324, but rather also the first amplifier arrangement 308 and the second amplifier arrangement 324 can be switched or circuit-connected parallel to one another. This necessitates modifications in the at least one switch that is allocated to the first amplifier arrangement 308, and the at least one switch that is allocated to the second amplifier arrangement 324. By means of these switches it must additionally be possible to supply the second measurement signal 325 also to the first amplifier arrangement 308 and to supply the first measurement signal 311 to the second amplifier arrangement 324. This is illustrated by additional connection lines in the simplified block circuit diagram according to FIG. 3.

To realize the filter charge transfer or copying it must additionally be possible also to copy the filter coefficients and the state memories or the state memory contents of the second amplifier arrangement 324 or the digital filters of the second digital signal processing unit 329 to the first amplifier arrangement 308 or the corresponding digital filters of the first digital signal processing unit 322, and vice versa. This is illustrated by a double-headed arrow 331 in FIG. 3.

The progression or sequence of the background calibration and adjustment or interruption-free calibration and adjusting is represented in the measuring amplifier 303 according to the third example embodiment with two channels and three internal amplifier arrangements 307, 308 and 324, for example as follows.

At first the first amplifier arrangement 308 is disposed in the measuring branch or measuring path. The first measurement signal 311 is supplied to it and it amplifies, digitizes and processes the same. The measurement values 316 that are thereby produced from the first measurement signal 311 are outputted via the selection arrangement 309.

The additional amplifier arrangement 307 is now calibrated and if necessary adjusted. For this, the first reference signal 312 and the second reference signal 313 are used, which in this case can represent e.g. a zero value and an end value of the first measurement signal 311.

When the errors of the additional amplifier arrangement 307 have been calibrated-out or adjusted-out, then the first measurement signal 311 is supplied to it and it amplifies, digitizes and processes the same. After the oscillating-in through the start-up transient or "copying-in" of its filters, the measurement values 315 produced by it from the first measurement signal 311 are outputted via the selection arrangement 309.

The first amplifier arrangement 308 is now no longer taking part in the measurement and can be removed from the measuring path. As soon as this has occurred, the first amplifier arrangement 308 is calibrated and if necessary adjusted. In this time period the additional amplifier arrangement 307, with an accuracy that remains constant, takes over the measuring task of the first amplifier arrangement 308.

Next, not again the first measurement signal 311 but rather the second measurement signal 325 is to be supplied to the first amplifier arrangement 308. Therefore, for its calibration, the first reference signal 312 and the second reference signal 313 or further reference signals not illustrated in the simplified block circuit diagram according to FIG. 3, which are now produced with use of the voltage that is fed back from the second measuring transducer that supplies the second measurement signal 325, and which can represent e.g. a zero value and an end value of the second measurement signal 325, are used.

When the errors of the first amplifier arrangement 308 have been calibrated-out or adjusted-out, then the second measurement signal 325 is supplied to it and it amplifies, digitizes and processes the same. After the oscillating-in through the start-up transient or the "copying-in" of its filters, the measurement values 316 produced by it from the second measurement signal 325 are outputted via the selection arrangement 309.

Beginning at this time point the second amplifier arrangement 324 is no longer taking part in the measurement and is removed from the measuring path. It can now be used for replacing another amplifier arrangement, in this case the additional amplifier arrangement 307.

The second amplifier arrangement 324 is calibrated and if necessary adjusted. For this, the first reference signal 312 and the second reference signal 313 or further reference signals that are not illustrated in the simplified block circuit diagram according to FIG. 3, which are now produced with use of the voltage that is fed back from the first measuring transducer that supplies the first measurement signal 311, and which can represent e.g. a zero value and an end value of the first measurement signal 311, are used.

When the errors of the second amplifier arrangement 324 have been calibrated-out or adjusted-out, then the first measurement signal 311 is supplied to it and it amplifies, digitizes and processes the same. After the oscillating-in through the start-up transient or "copying-in" of its filters, the measurement values 326 produced by it from the first measurement signal 311 are outputted via the selection arrangement 309.

The additional amplifier arrangement 307 is now no longer taking part in the measurement and can be removed from the measuring path. At this time, measurement values 326 corresponding to the first measurement signal 311 are produced by the second amplifier arrangement 324 and measurement values 316 corresponding to the second measurement signal 325 are produced by the first amplifier arrangement 308, and are respectively outputted via the selection arrangement 309. Thereby the second amplifier arrangement 324 has taken over the original measuring task of the first amplifier arrangement 308, and vice versa.

Next, the additional amplifier arrangement 307 is again calibrated and if necessary adjusted. This shall now not again take over the first measurement signal 311, but rather the second measurement signal 325 from the first amplifier arrangement 308. Therefore, for its calibration, now the first reference signal 312 and the second reference signal 313 or further reference signals not shown in the simplified block circuit diagram according to FIG. 3, which are produced with use of the voltage that is fed back from the second measuring transducer that supplies the second measurement signal 325, and which can represent e.g. a zero value and an end value of the second measurement signal 325, are used.

When the errors of the additional amplifier arrangement 307 have been calibrated-out or adjusted-out, the second measurement signal 325 is supplied to it and it amplifies, digitizes and processes the same. After the oscillating-in through the start-up transient or the "copying-in" of its filters, the measurement values 315 produced by it from the second measurement signal 325 are outputted via the selection arrangement 309.

The first amplifier arrangement 308 is now no longer taking part in the measurement and can be removed from the measuring path. As soon as this has occurred, the first amplifier arrangement 308 is calibrated and if necessary adjusted. Next it shall again take over the first measurement signal 311, and particularly from the second amplifier arrangement 324. Therefore, for its calibration, once again the first reference signal 312 and the second reference signal 313, which are produced with use of the voltage that is fed back from the first measuring transducer that supplies the first measurement signal 311, and which can represent e.g. a zero value and an end value of the first measurement signal 311, are used.

When the errors of the first amplifier arrangement 308 have been calibrated-out or adjusted-out, the first measurement signal 311 is supplied to it and it amplifies, digitizes and processes the same. After the oscillating-in through the start-up transient or the "copying-in" of its filters, the measurement values 316 produced by it from the first measurement signal 311 are outputted via the selection arrangement 309.

Beginning at this time point the second amplifier arrangement 324 is no longer taking part in the measurement and is removed from the measuring path. It can now again be used for replacing the additional amplifier arrangement 307.

The second amplifier arrangement 324 is calibrated and if necessary adjusted. Next, it shall again take over the second measurement signal 325 and particularly from the additional amplifier arrangement 307. Therefore, for its calibration, the first reference signal 312 and the second reference signal 313 or further reference signals not shown in the simplified block circuit diagram according to FIG. 3, which are now produced with use of the voltage that is fed back from the second measuring transducer that supplies the second measurement signal 325, and which can represent e.g. a zero value and an end value of the second measurement signal 325, are used.

When the errors of the second amplifier arrangement 325 have been calibrated-out or adjusted-out, the second measurement signal 325 is supplied to it and it amplifies, digitizes and processes the same. After the oscillating-in through the start-up transient or "copying-in" of its filters, the measurement values 326 produced by it from the second measurement signal 325 are outputted via the selection arrangement 309.

The additional amplifier arrangement 307 is now no longer taking part in the measurement and is removed from the measuring path. Measurement values 316 corresponding to the first measurement signal 311 are produced by the first amplifier arrangement 308 and measurement values 326 corresponding to the second measurement signal 325 are produced by the second amplifier arrangement 324, and are respectively outputted via the selection arrangement 309. Thereby the original condition or state is again achieved.

Simply an exemplary sequence or progression is described above. Because according to the third example embodiment, each amplifier arrangement can be switched or circuit-connected parallel to each other amplifier arrangement, and thereby correspondingly can replace it, numerous variants are possible especially in a measuring amplifier with more than two channels and therefore more than three amplifier arrangements. Thus, just to name one example, at the beginning the additional amplifier arrangement could replace the last amplifier arrangement instead of the first amplifier arrangement, and the entire rotation of the amplifier arrangements could proceed in the opposite sequence. The free switchability of each individual amplifier arrangement enables a completely flexible back-and-forth switching between the amplifier arrangements and taking-over of measurement signals or channels. Thus many other variants are conceivable.

The explanations regarding the filter charge transfer or copying, the switching time points, the switches used for the switching-over, the cyclical repetition of the progression or sequence, and a few possible variants in connection with the first example embodiment also apply for the third example embodiment.

According to a fourth example embodiment, which is illustrated in FIG. 1 for a measuring amplifier with only one channel similarly as the first example embodiment, the measuring amplifier comprises, for each one of its channels, its own respective additional amplifier arrangement. Thus, not only one additional amplifier arrangement is necessary as in the previous example embodiments. As a result, in a measuring amplifier with N channels, 2×N amplifier arrangements instead of N+1 amplifier arrangements are necessary.

Thereby, it is true that the hardware complexity or expenditure is higher than in the other example embodiments. However in exchange the fourth example embodiment can also be applicable for measuring amplifiers with galvanically separated or isolated channels, and even for these can operate with high accuracy. Moreover, the presence of an additional amplifier arrangement for each individual channel makes it possible to carry out the calibration and adjustment for several channels simultaneously, and thereby to carry out the calibration and adjustment method with a higher frequency or a shorter cycle time. This can further increase the accuracy.

The explanations regarding the progression or sequence of the interruption-free calibration and adjustment for one channel, the filter charge transfer or copying, the switchover time points, the switches used for the switching-over, the cyclical repetition of the sequence or progression, and a few possible variants in connection with the first example embodiment also apply for the fourth example embodiment.

Figure 4:
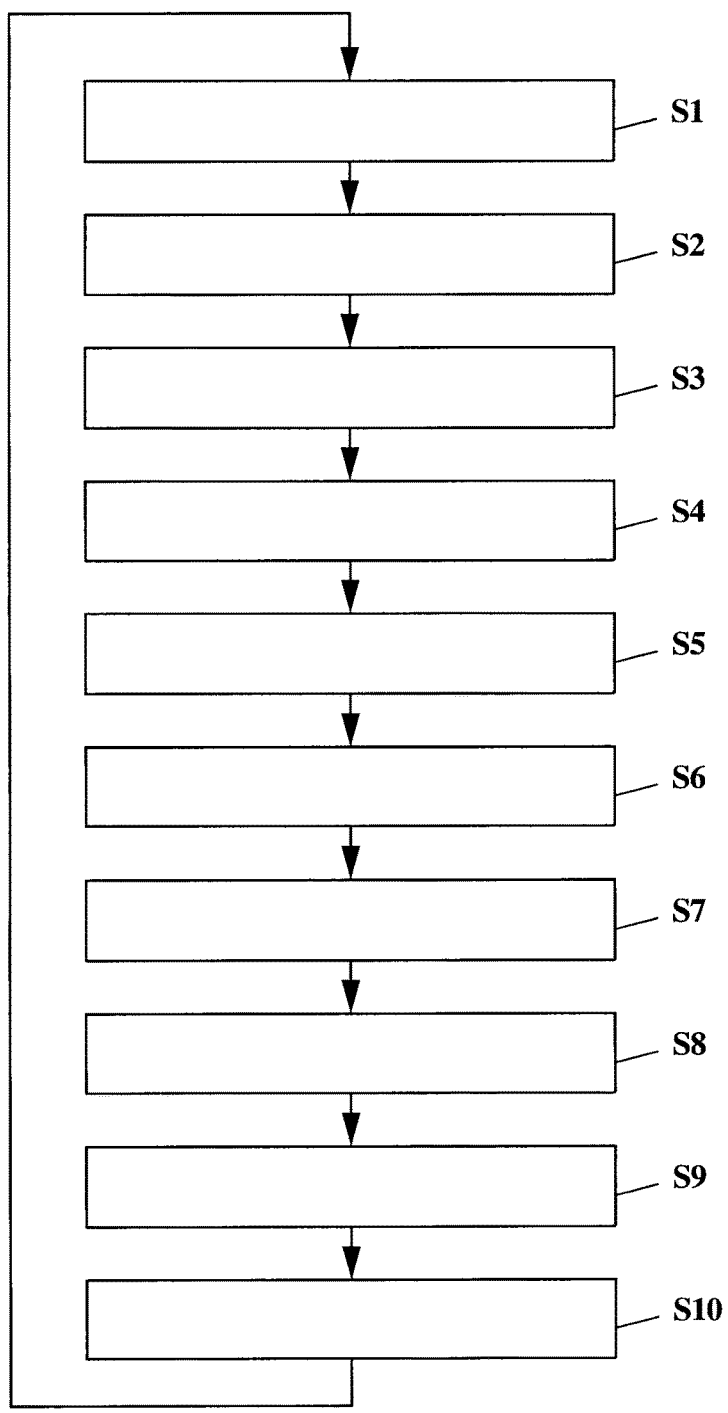
FIG. 4 a flow diagram with the fundamental steps of a method for the interruption-free calibrating and adjusting of a measuring amplifier.

FIG. 4 shows the flow diagram with the fundamental steps of a method for the interruption-free calibrating and adjusting of a measuring amplifier, which are common to the above described example embodiments. These are the following steps, for a measuring amplifier with N measurement signals, which comprises at least N+1 amplifier arrangements and is configured for outputting N measurement values that correspond to the N measurement signals, whereby N≥1 pertains and an index i runs from 1 to N.

In a step S1 an $i^{th}$ measurement signal of the N measurement signals is supplied to an $i^{th}$ amplifier arrangement of the at least N+1 amplifier arrangements. In a step S2 measurement values produced by the $i^{th}$ amplifier arrangement from the $i^{th}$ measurement signal are outputted. In a step S3 at least two $i^{th}$ reference signals are supplied to a further amplifier arrangement of the at least N+1 amplifier arrangements. In a step S4 the further amplifier arrangement is calibrated with the aid of the at least two $i^{th}$ reference signals, whereby a zero point error and an amplification error of the further amplifier arrangement are determined. In a step S5 the further amplifier arrangement is adjusted, in the case that at least one of the errors determined for it lies above a prescribed threshold value for this error. In a step S6 the $i^{th}$ measurement signal is supplied to the further amplifier arrangement. In a step S7 measurement values produced by the further amplifier arrangement from then $i^{th}$ measurement signal are outputted. In a step S8 at least two reference signals are supplied to the $i^{th}$ amplifier arrangement. In a step S9 the $i^{th}$ amplifier arrangement is calibrated with the aid of the at least two reference signals, whereby a zero point error and an amplification error of the $i^{th}$ amplifier arrangement are determined. In a step S10 the $i^{th}$ amplifier arrangement is adjusted in the case that at least one of the errors determined for it lies above the prescribed threshold value for this error.

The steps S1 to S10 are carried out for each channel of the so measuring amplifier and the entire process is cyclically repeated, which is indicated by an arrow from the block representing step S10 back to the block representing the step S1 in the flow diagram according to FIG. 4.

After the step S10, depending on the example embodiment, still at least one further step can additionally be carry out. Thus, e.g. in the first, second and fourth example embodiment, after the step S10, the $i^{th}$ measurement signal can again be supplied to the $i^{th}$ amplifier arrangement as was already the case in the step S1, that is to say the same measurement signal as before its calibration. Thereupon once again the measurement values produced by the $i^{th}$ amplifier arrangement from the $i^{th}$ measurement signal can be outputted as already took place in the step S2. In the third example embodiment, in comparison, after the step S10, a different measurement signal can be supplied to the $i^{th}$ amplifier arrangement, that is to say a measurement signal different from that before its calibration. In other words, after the step S10, the same measurement signal as before its calibration or a measurement signal different from that before its calibration can be supplied to the $i^{th}$ amplifier arrangement.

Furthermore, between individual steps of the steps S1 to S10, still additional steps such as for example steps of the filter charge transfer or copying or the correcting of a difference of the intrinsic errors of the amplifier arrangements can be carried out.

The index i used for the description of the steps S1 to S10 and in the patent claims does not necessarily have to correspond with the designation of the amplifier arrangements, measurement signals and reference signals in the preceding description of the example embodiments. Thus, e.g. with i=1, the $i^{th}$ amplifier arrangement does not necessarily have to be the first amplifier arrangement and $i^{th}$ measurement signal does not necessarily have to be the first measurement signal. Similarly, the $i^{th}$ reference signals do not need to be reference signals corresponding to reference values of the first measurement signal. This pertains especially to the third example embodiment, which makes possible a very flexible back-and-forth switching between the amplifier arrangements.

Moreover, it is true that the sequence of the steps S1 to S10 and the further steps defined in the patent claims is basically as set forth. However, in part, several successive steps can be carried out in parallel, e.g. the steps of supplying a measurement signal to one amplifier arrangement, outputting the measurement values produced therefrom by it, supplying reference signals to another amplifier arrangement, and calibrating the other amplifier arrangement with the reference signals.

While in each one of the four example embodiments several amplifier arrangements with respectively several components have been described above, also other configurations are possible. For example a few or all amplifier arrangements and/or further components of the measuring amplifier can be realized in the form of an integrated circuit, or also only respectively certain components of each amplifier arrangement such as e.g. amplifier circuit and analog-digital converter can be integrated with one another. Similarly, for example analog instead of digital measurement values can be produced, if respectively additionally a digital-analog converter is provided after a digital signal processing unit. It would even be conceivable to utilize the basic or fundamental principle of the explained method for interruption-free calibrating and adjusting of a measuring amplifier for a measuring amplifier that operates purely in an analog manner.

Summarizing, the present invention relates to a measuring amplifier with background calibration and adjustment as well as to a method for carrying out the background calibration and adjustment for such a measuring amplifier. The measuring amplifier amplifies, digitizes and processes at least one measurement signal from at least one measuring transducer with the aid of at least one amplifier arrangement. This can be temporarily or intermittently replaced by an additional amplifier arrangement, which makes possible its interruption-free calibration and if necessary adjustment. In the calibration, both a zero point error as well as an amplification error of the amplifier arrangement are reliably determined. Moreover, the amplifier arrangement is calibrated directly and not indirectly. Thereby, a high accuracy is achieved without measurement interruption. Moreover, generally only one additional amplifier arrangement is required even in measuring amplifiers with several channels.

The invention claimed is:

1. A measuring amplifier that is calibrateable and adjustable without interruption for N measurement signals that are supplied to the measuring amplifier, wherein N≥1, and wherein the measuring amplifier comprises the following features:
    at least N+1 amplifier arrangements that each respectively comprise and amplifier circuit, an analog-digital converter, and a digital signal processing unit including at least one digital filter;
    at least N+1 switches that are each respectively allocated to a respective one of the N+1 amplifier arrangements;
    at least one reference signal generating arrangement configured to produce reference signals; and
    at least one selection arrangement; wherein:
    each amplifier arrangement of the N+1 amplifier arrangements is calibratable and adjustable with the aid of the reference signals produced by the at least one reference signal generating arrangement, a selected one amplifier arrangement of the at least N+1 amplifier arrangements in switchable parallel to each other one of the amplifier arrangements, or each amplifier arrangement of the at least N+1 amplifier arrangements is respectively switchable parallel to each other one of the amplifier arrangements, or each amplifier arrangement of the at least N+1 amplifier arrangements is switchable parallel to exactly one other one of the amplifier arrangements, wherein the respective switching-over can be carried out via corresponding switches of the at least N+1 switches, and the at least one selection arrangement is configured for the outputting of N measurement values that correspond to the N measurement signals.

2. A measuring system comprising a measuring amplifier according to claim 1 and at least one measuring transducer that is configured to supply the N measurement signals to the measuring amplifier.

3. The measuring amplifier according to claim 1, wherein the selected one amplifier arrangement is switchable parallel to each other one of the amplifier arrangements.

4. The measuring amplifier according to claim 1, wherein each amplifier arrangement of the at least N+1 amplifier arrangements is respectively switchable parallel to each other one of the amplifier arrangements.

5. The measuring amplifier according to claim 1, wherein each amplifier arrangement of the at least N+1 amplifier arrangements is switchable parallel to the exactly one other one of the amplifier arrangements.

6. The measuring amplifier according to claim 1, wherein the measuring amplifier is configured to be calibrated and adjusted by performing the following steps for i=1 to N:
supplying an $i^{th}$ measurement signal of the N measurement signals to an $i^{th}$ amplifier arrangement of the at least N+1 amplifier arrangements;
outputting the measurement values produced by the $i^{th}$ amplifier arrangement from the $i^{th}$ measurement signal;
supplying at least two $i^{th}$ reference signals to a further amplifier arrangement of the at least N+1 amplifier arrangements;
calibrating the further amplifier arrangement with the aid of the at least two $i^{th}$ reference signals, whereby a zero point error and an amplification error of the further amplifier arrangement are determined;
adjusting the further amplifier arrangement to reduce at least one of the errors determined for it when this at least one error lies above a prescribed threshold value for this error;
supplying the $i^{th}$ measurement signal to the further amplifier arrangement;
after the calibrating and the adjusting of the further amplifier arrangement, outputting the measurement values produced by the further amplifier arrangement from the $i^{th}$ measurement signal;
supplying at least two reference signals to the $i^{th}$ amplifier arrangement;
calibrating the $i^{th}$ amplifier arrangement with the aid of the at least two reference signals that are supplied to it, whereby a zero point error and an amplification error of the $i^{th}$ amplifier arrangement are determined; and
adjusting the $i^{th}$ amplifier arrangement to reduce at least one of the errors determined for it when this at least one error lies above a prescribed threshold value for this error;
wherein the outputting of the measurement values by the $i^{th}$ amplifier arrangement is interrupted, and the outputting of the measurement values by the further amplifier arrangement is performed, at least during the calibrating and the adjusting of the $i^{th}$ amplifier arrangement.

7. A method for interruption-free calibrating and adjusting of the measuring amplifier according to claim 1, for N measurement signals wherein N≥1, and wherein the method comprises the following steps performed for i=1 to N:
supplying an $i^{th}$ measurement signal of the N measurement signals to an $i^{th}$ amplifier arrangement of the at least N+1 amplifier arrangements;
outputting the measurement values produced by the $i^{th}$ amplifier arrangement from the $i^{th}$ measurement signal;
supplying at least two $i^{th}$ reference signals to a further amplifier arrangement of the at least N+1 amplifier arrangements;
calibrating the further amplifier arrangement with the aid of the at least two $i^{th}$ reference signals, whereby a zero point error and an amplification error of the further amplifier arrangement are determined;
adjusting the further amplifier arrangement to reduce at least one of the errors determined for it when this at least one error lies above a prescribed threshold value for this error;
supplying the $i^{th}$ measurement signal to the further amplifier arrangement;
after the calibrating and the adjusting of the further amplifier arrangement, outputting the measurement values produced by the further amplifier arrangement from the $i^{th}$ measurement signal;
supplying at least two reference signals to the $i^{th}$ amplifier arrangement;
calibrating the $i^{th}$ amplifier arrangement with the aid of the at least two reference signals that are supplied to it, whereby a zero point error and an amplification error of the $i^{th}$ amplifier arrangement are determined; and
adjusting the $i^{th}$ amplifier arrangement to reduce at least one of the errors determined for it when this at least one error lies above a prescribed threshold value for this error;
wherein the outputting of the measurement values by the $i^{th}$ amplifier arrangement is interrupted, and the outputting of the measurement values by the further amplifier arrangement is performed, at least during the calibrating and the adjusting of the $i^{th}$ amplifier arrangement.

8. The method according to claim 7, wherein j≥1, and wherein:
the further amplifier arrangement is an $N+j^{th}$ amplifier arrangement of the at least N+1 amplifier arrangements,
the at least two $i^{th}$ reference signals are used for the calibrating of the $i^{th}$ amplifier arrangement, and
after the step of the adjusting of the $i^{th}$ amplifier arrangement, the $i^{th}$ measurement signal is again supplied to the $i^{th}$ amplifier arrangement and the measurement values produced by it are outputted.

9. The method according to claim 7, wherein j≥1, and wherein:
for i=1, the further amplifier arrangement is an $N+j^{th}$ amplifier arrangement of the at least N+1 amplifier arrangements, at least two $i+1^{th}$ reference signals are used for the calibrating of the $i^{th}$ amplifier arrangement, and after the step of the adjusting of the $i^{th}$ amplifier arrangement a measurement signal of the N measurement signals that was previously supplied to an $i+1^{th}$ amplifier arrangement of the at least N+1 amplifier arrangements is supplied to the $i^{th}$ amplifier arrangement, and measurement values produced by the $i^{th}$ amplifier arrangement from this measurement signal are outputted, for $1<i<N$, the further amplifier arrangement is an $i-1^{th}$ amplifier arrangement of the at least N+1 amplifier arrangements, at least two $i+1^{th}$ reference signals are used for the calibrating of the $i^{th}$ amplifier arrangement, and after the step of the adjusting of the $i^{th}$ amplifier arrangement a measurement signal of the N measurement signals that was previously supplied to an $i+1^{th}$ amplifier arrangement of the at least N+1 amplifier arrangements is supplied to the $i^{th}$ amplifier arrangement, and measurement values produced by the $i^{th}$ amplifier arrangement from this measurement signal are outputted, and for $i=N$, the further amplifier arrangement is an $i-1^{th}$ amplifier arrangement of the at least N+1 amplifier arrangements, at least two $N+j^{th}$ reference signals are used for the calibrating of the $i^{th}$ amplifier arrangement, and after the step of the adjusting of the $i^{th}$ amplifier arrangement a measurement signal of the N measurement signals that was previously supplied to the $N+j^{th}$ amplifier arrangement of the at least N+1 amplifier arrangements is supplied to the $i^{th}$ amplifier arrangement and the measurement values produced by the $i^{th}$ amplifier arrangement from this measurement signal are outputted.

10. The method according to claim 7, wherein the measuring amplifier comprises at least 2×N of the amplifier arrangements, and wherein:

the further amplifier arrangement is an $i+N^{th}$ amplifier arrangement of the at least 2×N amplifier arrangements, the at least two $i^{th}$ reference signals are used for the calibrating of the $i^{th}$ amplifier arrangement, and after the step of the adjusting of the $i^{th}$ amplifier arrangement, the $i^{th}$ measurement signal is again supplied to the $i^{th}$ amplifier arrangement and the measurement values produced by it are outputted.

11. The method according to claim 7, wherein the amplifier arrangements of the measuring amplifier each respectively comprise at least one filter, and wherein:

after the step of the supplying of the $i^{th}$ measurement signal to the further amplifier arrangement and before the step of the outputting of measurement signals produced by the further amplifier arrangement from the $i^{th}$ measurement signal, waiting until the at least one filter of the further amplifier arrangement has stabilized after a start-up transient, and after a step of supplying, to the $i^{th}$ amplifier arrangement, a different measurement signal of the N measurement signals that was previously supplied to a different amplifier arrangement of the at least N+1 amplifier arrangements, and before a step of outputting the measurement values produced by the $i^{th}$ amplifier arrangement from the different measurement signal, waiting until the at least one filter of the $i^{th}$ amplifier arrangement has stabilized after a start-up transient.

12. The method according to claim 7, wherein the amplifier arrangements of the measuring amplifier each respectively comprise at least one digital filter, and wherein:

after the step of the supplying of the $i^{th}$ measurement signal to the further amplifier arrangement, and before the step of the outputting of measurement values produced by the further amplifier arrangement from the $i^{th}$ measurement signal, a step of copying filter coefficients and state memories of the at least one digital filter of the $i^{th}$ amplifier arrangement to the at least one digital filter of the further amplifier arrangement is carried out, and after a step of supplying, to the $i^{th}$ amplifier arrangement, a different measurement signal of the N measurement signals that was previously supplied to a different amplifier arrangement of the at least N+1 amplifier arrangements, and before a step of outputting the measurement values produced by the $i^{th}$ amplifier arrangement from the other measurement signal, a step of copying filter coefficients and state memories of the at least one digital filter of the other amplifier arrangement to the at least one digital filter of the $i^{th}$ amplifier arrangement is carried out.

13. The method according to claim 7, wherein:

after the step of the supplying of the $i^{th}$ measurement signal to the further amplifier arrangement, and before the step of the outputting of measurement values produced by the further amplifier arrangement from the $i^{th}$ measurement signal, a step of correcting a difference of the intrinsic errors of the $i^{th}$ amplifier arrangement and of the further amplifier arrangement is carried out, and after a step of supplying, to the $i^{th}$ amplifier arrangement, a different measurement signal of the N measurement signals that was previously supplied to a different amplifier arrangement of the at least N+1 amplifier arrangements, and before a step of outputting the measurement values produced by the $i^{th}$ amplifier arrangement from the different measurement signal, a step of correcting a difference of the intrinsic errors of the different amplifier arrangement and of the $i^{th}$ amplifier arrangement is carried out.

14. The method according to claim 7, wherein all of the steps are cyclically repeated in order automatically to calibrate and if necessary to adjust the measuring amplifier at prescribed time intervals.

15. The method according to claim 7, wherein the respective zero point error and the respective amplification error of each one of the at least N+1 amplifier arrangements are determined by a direct calibration with the aid of the respective reference signals, so that the respective zero point error and the respective amplification error are determined correctly even when a respective one of the N measurement signals varies quasi-statically, and so that no error propagation arises and no measurement errors are caused thereby.

16. The method according to claim 7, wherein the performing of the steps of the method is sequenced and controlled by a controller device.

17. The method according to claim 7, further comprising a step of producing the N measurement signals with at least one measurement transducer that receives a respective mechanical input and converts the respective mechanical input to a respective electrical signal as a respective one of the N measurement signals.

18. The method according to claim 7, wherein the steps of outputting the measurement values involve supplying the measurement values to an output device which outputs the measurement values in a perceivable manner.

19. The method according to claim 7, further comprising activating at least one of the switches to switch between the supplying of the $i^{th}$ measurement signal to the $i^{th}$ amplifier arrangement and/or the supplying of the $i^{th}$ measurement signal to the further amplifier arrangement.

20. The method according to claim 19, further comprising activating the at least one selection arrangement to switch between the outputting of the measurement values produced by the $i^{th}$ amplifier arrangement or the outputting of the measurement values produced by the further amplifier arrangement.

21. The method according to claim 7, further comprising activating the at least one selection arrangement to switch between the outputting of the measurement values produced by the $i^{th}$ amplifier arrangement or the outputting of the measurement values produced by the further amplifier arrangement.

\* \* \* \* \*

UNITED STATES PATENT AND TRADEMARK OFFICE
CERTIFICATE OF CORRECTION

PATENT NO. : 10,295,383 B2
APPLICATION NO. : 14/916398
DATED : May 21, 2019
INVENTOR(S) : Marco M. Schaeck et al.

Page 1 of 1

It is certified that error appears in the above-identified patent and that said Letters Patent is hereby corrected as shown below:

In the Specification

Column 5,
Line 27, after "ment and", delete "m";

Column 19,
Line 23, after "from", replace "then" with --the--;
Line 34, before "measuring", delete "so";

In the Claims

Column 20,
Line 52, after "is", replace "calibrateable" with --calibratable--;
Line 58, after "comprise", replace "and" with --an--;

Column 21,
Line 4, after "arrangements", replace "in" with --is--.

Signed and Sealed this
Tenth Day of November, 2020

Andrei Iancu
*Director of the United States Patent and Trademark Office*